(12) United States Patent
Nocito et al.

(10) Patent No.: US 8,748,729 B2
(45) Date of Patent: Jun. 10, 2014

(54) ROLLABLE PHOTOVOLTAIC COMPOSITE AND A SOLAR PROTECTION DEVICE WITH SUCH A COMPOSITE

(75) Inventors: Christophe Nocito, Roubaix (FR); Vladan Koncar, Haubourdin (FR); Laurent Raymond, Fournes en Weppes (FR)

(73) Assignee: Dickson Constant S.A., Wasquehal (FR)

( * ) Notice: Subject to any disclaimer, the term of this patent is extended or adjusted under 35 U.S.C. 154(b) by 619 days.

(21) Appl. No.: 12/548,023

(22) Filed: Aug. 26, 2009

(65) Prior Publication Data

US 2010/0051084 A1 Mar. 4, 2010

(30) Foreign Application Priority Data

Aug. 29, 2008 (FR) ...................................... 08 55829

(51) Int. Cl.
*H01L 31/045* (2006.01)
(52) U.S. Cl.
USPC ............................ 136/245; 136/251; 136/244
(58) Field of Classification Search
USPC ....................... 136/243–252, 245; 438/64, 67
See application file for complete search history.

(56) References Cited

U.S. PATENT DOCUMENTS

| | | | | |
|---|---|---|---|---|
| 4,617,420 A * | 10/1986 | Dilts et al. | ..................... | 136/244 |
| 4,636,579 A | 1/1987 | Hanak et al. | | |
| 5,433,259 A * | 7/1995 | Faludy | ............................ | 160/67 |
| 5,707,459 A * | 1/1998 | Itoyama et al. | ................ | 136/251 |
| 5,979,834 A * | 11/1999 | Falbel | ......................... | 244/172.8 |
| 6,288,324 B1 * | 9/2001 | Komori et al. | ................ | 136/244 |
| 2007/0056625 A1 * | 3/2007 | Higuchi et al. | ................ | 136/244 |
| 2007/0277867 A1 * | 12/2007 | Heidenreich | .................. | 136/245 |
| 2007/0295385 A1 * | 12/2007 | Sheats et al. | ................... | 136/251 |
| 2008/0142071 A1 * | 6/2008 | Dorn et al. | ..................... | 136/245 |
| 2008/0163984 A1 * | 7/2008 | Lambey | ............................. | 160/2 |
| 2008/0190476 A1 * | 8/2008 | Baruh | ............................ | 136/245 |
| 2009/0019797 A1 * | 1/2009 | Gunn | ............................... | 52/202 |
| 2009/0095284 A1 * | 4/2009 | Klotz | ............................. | 126/704 |
| 2010/0013406 A1 * | 1/2010 | Bhattacharya | ................ | 315/291 |

FOREIGN PATENT DOCUMENTS

| | | |
|---|---|---|
| FR | 2 823 527 A | 10/2002 |
| WO | WO 2004/077577 A1 | 9/2004 |
| WO | WO 2006/072819 A | 7/2006 |

* cited by examiner

*Primary Examiner* — Jayne Mershon
(74) *Attorney, Agent, or Firm* — Kenyon & Kenyon LLP

(57) ABSTRACT

The subject matter of this present invention is a rollable photovoltaic composite, used in particular for solar protection, which includes at least one flexible photovoltaic panel and at least one textile panel, on the outside face of which is laminated the said photovoltaic panel by means of a first connecting layer, characterized in that, in the transverse direction to that in which it is to be rolled, and at any level of the photovoltaic panel, it has a thickness that is more-or-less constant, including one or more zones of reduced thickness, the said thickness corresponding to the thickness of the textile panel possibly covered with a film on its inside face, and in that the width is no more than 8 centimeters, so as to eliminate the formation of folds during rolling or in the deployed position.

16 Claims, 2 Drawing Sheets

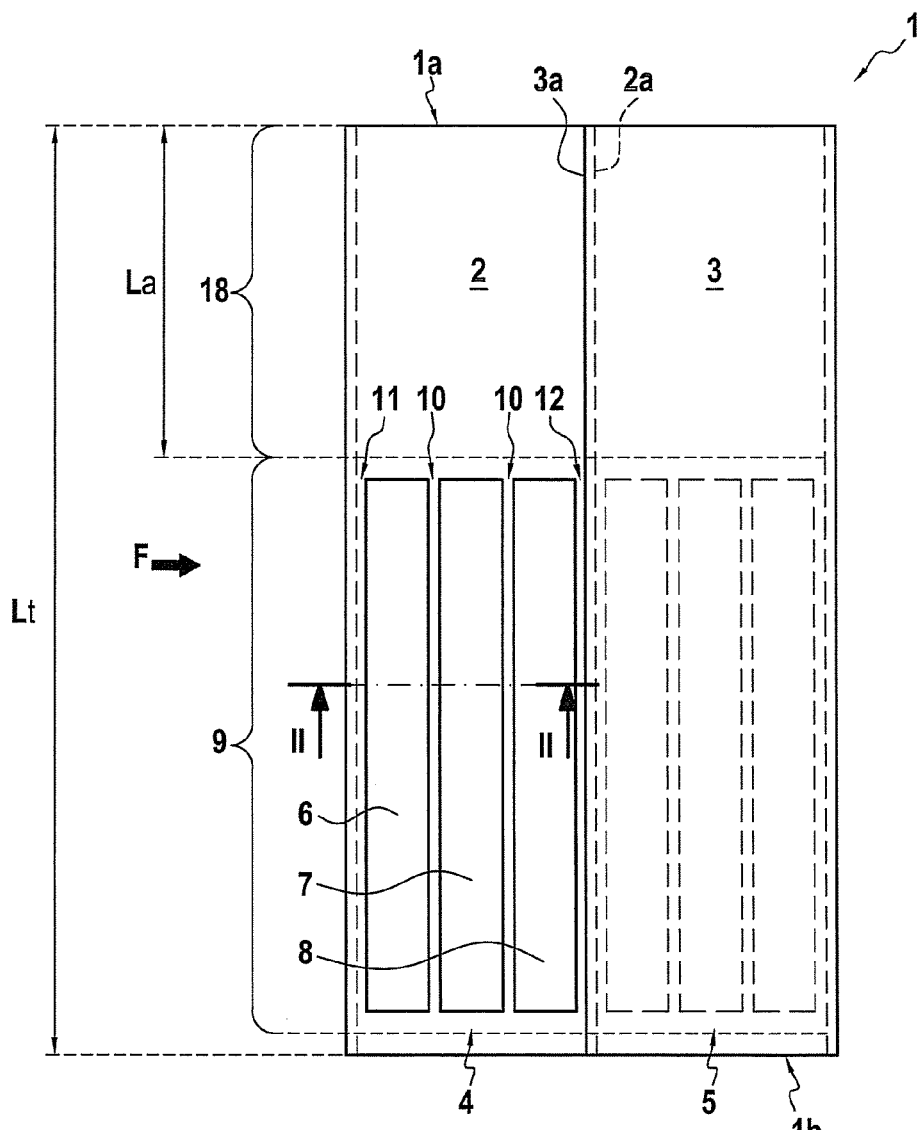
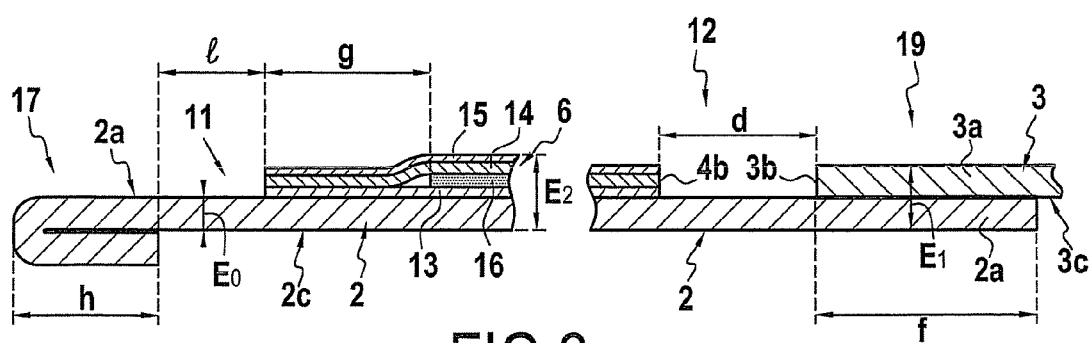

ROLLABLE PHOTOVOLTAIC COMPOSITE AND A SOLAR PROTECTION DEVICE WITH SUCH A COMPOSITE

This application claims priority to French Patent Application No. 0855829 filed 29 Aug. 2008, the contents of which are incorporated herein by reference.

FIELD OF THE INVENTION

This present invention concerns the field of rollable photovoltaic composites, in particular for use as a solar protection panel or blind, and which includes at least one photovoltaic cell.

BACKGROUND OF THE INVENTION

A photovoltaic cell is a generator, commonly called a photostack or a photovoltaic cell that makes use of the photovoltaic effect. The photovoltaic effect can be defined as being the appearance of a potential difference between two layers of a semiconductor slice in which the conductivities are opposite, or between a semiconductor and a metal, under the effect of a light stream. A photovoltaic cell generates a direct current.

A semiconductor is generally a solid material in that the intermediate resistivity between that of the metals and that of the insulation materials varies under the influence of factors such as the temperature, the lighting, the electric field, etc.

The main known semiconductor materials are germanium, silicon and selenium.

We are already familiar with a portable solar charger, described in WO 2004/077577. This charger includes a flexible photovoltaic panel that is permanently fixed onto a flexible textile material. The said solar or photovoltaic panel can be stitched along its inactive edges to the flexible textile sheet, or glued, or indeed welded by the application of heat or ultrasound.

The manufacture of this type of solar charger is still artisanal in nature even today. There are no techniques up to this present time that can be used to manufacture assemblies resulting from the assembly of a textile sheet and one or more flexible photovoltaic panels that are of large dimension in an industrial manner.

These small-dimension chargers have a small collection surface for the incident rays. Moreover, when they are arranged to form solar protection panels, to constitute a blind for example, the storage enclosures have to be redimensioned, if only to receive the textile sheet in the rolled state, since the thickness will have very significantly increased or even doubled once assembled with one or more photovoltaic panels. In addition, one notes the formation of fatal folds during use, and these may be able to hamper the rolling and its introduction into the storage container, or indeed that damage the aesthetic appearance of the composite when it is in the deployed position.

SUMMARY OF THE INVENTION

In this present text, use is made of the term outside to designate that which is intended to be turned toward the sunlight when in final use, and naturally the reverse applies to the term inside.

This present invention overcomes the aforementioned technical problems. According to a first aspect, its subject matter is a rollable photovoltaic composite, employed in particular for solar protection, which includes at least one flexible photovoltaic panel and at least one textile panel on the outside face, on which the said photovoltaic panel is laminated by means of a first connecting layer. In a characteristic manner, in the direction transverse to that in which it is to be rolled and at any level of the photovoltaic panel, the said composite is of more-or-less constant thickness, including one or more reduced thickness zones, where the said reduced thickness corresponds to the thickness of the textile panel possibly covered with a film on its inside face, each zone of reduced thickness having a width that is no more than 8 centimeters. This particular arrangement is used to prevent the formation of folds in the composite, whether during the rolling operation or in the deployed position.

When tests were performed, the applicant was in fact able to observe that by reducing the width of the longitudinal zones of reduced thickness, in the part of the composite that includes at least one photovoltaic panel, it was possible to limit or even to totally eliminate the formation of folds, provided that the width of each zone was no more than 8 centimeters. Of course, the sufficient width that is to be retained can depend on various parameters, in particular the weave of the textile panel, its thickness, and the tension that is applied to the composite during its use and when it is rolled.

In this present text, each photovoltaic panel is an assembly that includes at least one photovoltaic cell which is covered by a protective layer, this being in a material that allows passage of the light radiation, such as a transparent polytetrafluorethylene of the ETFE type, with the said protective layer being laminated on the cell by means of a second connecting layer. In this case, advantageously according to this present invention, the first and the second connecting layer and the protective layer have the same dimensions, these being greater than those of the photovoltaic cell.

This particular arrangement has at least two advantages. Firstly, it provides effective protection of the photovoltaic cell, the latter being included totally in the different connecting and protection layers, which limits the risks of damage. Secondly, for a given width of photovoltaic cell, it causes a large relative increase in the width of the thickness zone and correlatively reduces the width of the reduced thickness zone or zones. It should be noted that the photovoltaic cell, as such, has a relatively small thickness since it generally consists of a film on which is effected a deposition of semiconductor, in particular of silicon, the whole then having a thickness of the order of 50 µm. Comparatively, the connecting layers can be of the order of 200 to 500 µm and the protective layer of the order of 50 µm. Thus, depending on its width, in this case the photovoltaic panel has a thickness that remains more-or-less constant, even along the two lateral parts that are free of photovoltaic cells.

Advantageously, along its longitudinal edges the textile panel includes a rolled finishing hem formed by a stitched fold. Over the full width of such a rolled hem, the composite therefore has a thickness that is more-or-less double that of the textile panel. It is therefore possible, if necessary, to reduce the width of the reduced thickness zone or zones by increasing the width of this rolled finishing hem.

In an implementation variant, the composite includes at least two textile panels assembled in pairs by the superimposition and assembly, in particular by hot welding, of a portion extending the length of the adjacent longitudinal edges of the two panels. In addition, onto each textile panel at least one photovoltaic cell is laminated. Finally, the longitudinal edge of the textile panel lying above the other panel in the assembly is, in this case, at a distance d from the photovoltaic panel supported by this other textile panel. According to the invention, the value of this distance d is no more than 8 centimeters.

Admittedly, the optimal solution would be that there was only a very small amount of play, of a few millimeters, between the photovoltaic panel and the longitudinal edge in question. However, this is hard to envisage, given the constraints associated with the current assembly technology.

In any event, whatever the location of the zone of reduced thickness, it is important that its width should be as small as possible in order to limit or even to totally eliminate the formation of folds during the rolling of the composite or when the latter is in extension in the deployed position. Depending on the structure of the composite, in particular the weave and the thickness of the textile panel, the width of the reduced thickness zone or zones can vary in order to obtain the optimal result. Although acceptable results have been obtained with widths close to 8 centimeters, then the best results have been obtained with widths of no more than 4 centimeters, given that a width of the order of 2 centimeters enables one to ensure an absence of folds in any circumstances.

It is preferable that the inside face of the textile panel should be covered with a film since one of the objectives is to prevent the penetration of the said panel during the hot lamination of the first connecting layer between the photovoltaic cell and the textile panel. This film therefore acts as a barrier to the diffusion of the softened material of the connecting layer during the lamination. The presence of this film gives rise to a problem when the textile panels are assembled in pairs by superimposition and assembly by hot welding, due to the fact that the gluing against the coated face is then of mediocre quality, possibly causing delamination of the panels. In order to overcome this problem, the inside faces of the assembled textile panels are covered with the film in question, excepting the portion, known as the reserve portion, of the textile panel lying on top of the other in the assembly. Thus the gluing takes place between two faces that are both free of film.

According to an implementation variant, the composite includes a front part that is free of a photovoltaic panel. By front part is meant the part of the composite in which the transverse edge is intended to be fixed to a reception tube in order for it to be rolled. This front part, free of any photovoltaic panel, is used in the first place for the fixing of the composite to the reception tube. It can be seen that during the rolling of the composite, it is the front part that will first be wound around the reception tube followed by the rear part which includes the photovoltaic panel or panels. Admittedly, the photovoltaic cells are sufficiently flexible to be rolled, but when rolling with a minimal radius of curvature, there would otherwise be a risk of damage to the cell. Thus, in second place, for a photovoltaic cell having a given minimal radius of curvature, this particular arrangement allows one to reduce the radius of curvature of the reception tube.

In one preferred embodiment, the front part of the composite, which is free of any photovoltaic panel, has a length that makes it at least a quarter of the total length (Lt) of the said composite. In this case, the reception tube can have an outside radius that is less than or equal to 2 centimeters.

BRIEF DESCRIPTION OF THE DRAWINGS

This present invention will be understood more clearly on reading the description that follows of one example of implementation, given by way of a non-limiting example and illustrated by figures attached to this present document and in which:

FIG. 1 is a view from above of a rollable photovoltaic composite with two assembled textile panels and, on each textile panel, one photovoltaic panel with three cells;

FIG. 2 is a partial view along the plane of section II-II of the composite of FIG. 1;

DETAILED DESCRIPTION

Figure 3:
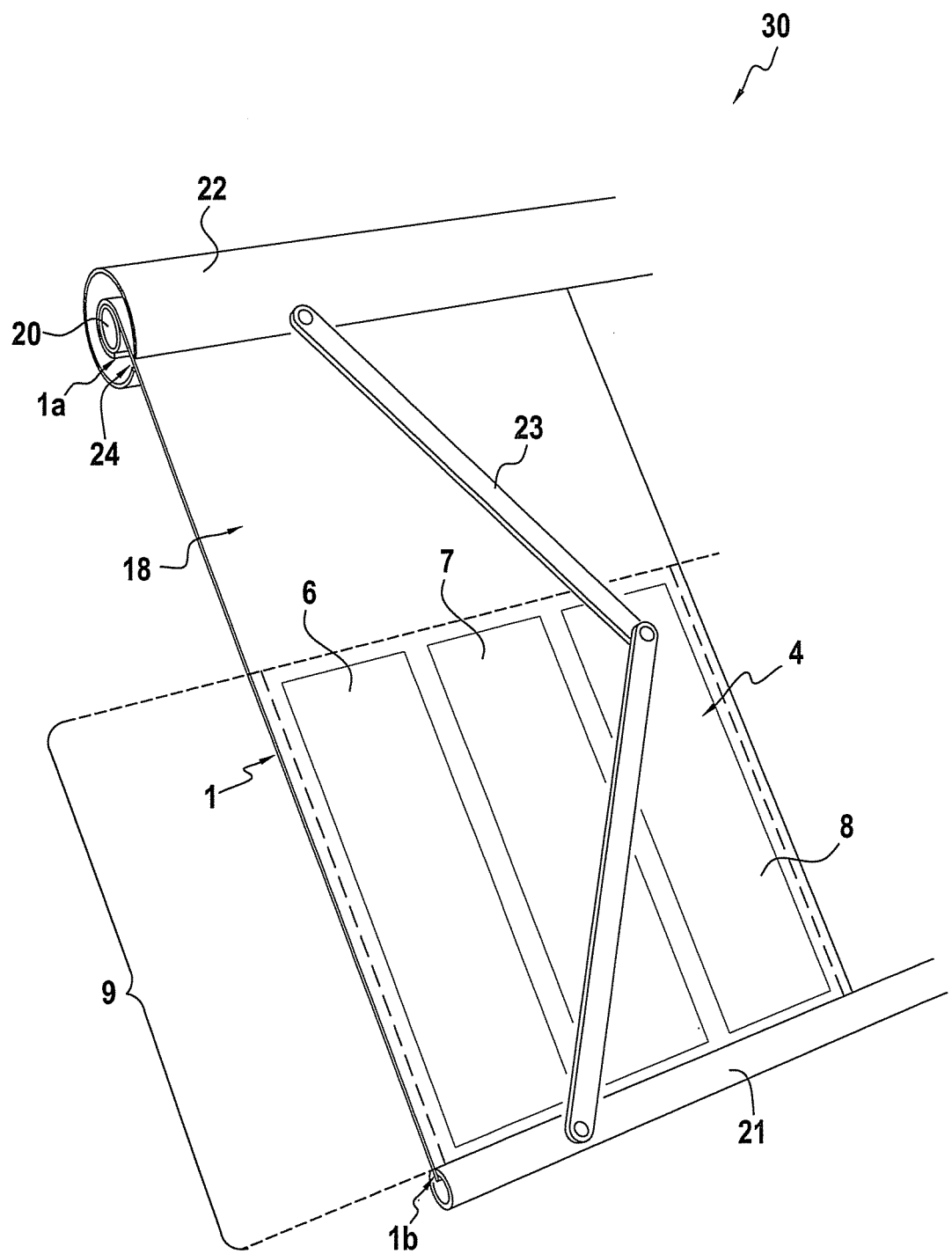
FIG. 3 is a view in perspective of a solar protection device for a dormobile (camper van) that includes a photovoltaic composite.

The rollable photovoltaic composite that will be described below and that is illustrated in the figures is intended to form a solar protection blind for a dormobile.

This description and this application naturally do not limit this present invention in any way.

In its simplest configuration, the composite of this present invention has a single textile panel, on the outside face of which is fixed a single photovoltaic cell, this attachment being achieved by hot lamination of a connecting layer formed from a thermofusible polymer, preferably a polymer based on EVA (a copolymer of ethylene and vinyl acetate). This photovoltaic cell is covered with a protective layer in a material that is transparent to the solar radiation, does not conduct electricity, and is resistant to abrasion. It can consist, for example, of a transparent polytetrafluorethylene of the ETFE type. Given that such a protective layer is not of itself adhesive, its attachment requires the use of a second connecting layer for its attachment onto the photovoltaic cell. This second connecting layer can be in the same material as the connecting layer that is used to fix the photovoltaic cell onto the textile panel, namely EVA for example.

The assembly made up by the protective layer, the second connecting layer and the photovoltaic cell constitutes a photovoltaic panel. In this present text, the term photovoltaic panel is also used in the case where there are several cells.

Of course, the number of textile panels and of photovoltaic cells will depend on the application concerned and therefore on the dimensions in terms of length and width that are desired, as well as the area of the photovoltaic cells necessary for this application. In the example shown, the composite (1) includes two textile panels (2, 3), each being laminated with a photovoltaic panel (4, 5) that itself includes three photovoltaic cells (6, 7, 8).

In a characteristic manner, according to this present invention, the arrangement of the different elements involved in the structure and the make-up of the composite (1) is such that the latter has a thickness (E2) that is more-or-less constant when we look at this thickness along the transverse direction symbolised by arrow (F) in FIG. 1, a direction that is perpendicular to that which is planned for the rolling of the composite, over the full length (9) of the photovoltaic panel (4, 5), with the said composite (1) including a single or several zones (11, 12) of reduced thickness (Eo). What is meant by the term reduced thickness (Eo) is a thickness that corresponds to the thickness of the textile panel (2, 3) possibly covered with a film on its inside face (2c). Moreover, the width (f) of the zone, or of each zone, of reduced thickness (Eo) is no more than 8 centimeters. Thus, according to the applicant, it is possible to limit or even to eliminate the risks of formation of folds on the composite during the rolling of the latter or when it is in the deployed position.

It was only after performing multiple tests that the applicant was able to observe that it was best to reduce as much as possible the width of the reduced thickness zones, that is of the longitudinal strips in which the textile panel alone, including its film if any, extends over the full length of the rear part (9) that includes the photovoltaic cells (6, 7, 8).

In this case, as it consists of the implementation example of FIG. 1, on the rear part (9) in question of the textile panel (2), there are two central longitudinal strips (10), a left lateral strip (11) and a right lateral strip (12).

The two central strips (10) correspond to the zones that lie between two adjacent photovoltaic cells (6, 7, 8).

In order that the thickness of the composite (1) is not a reduced thickness (Eo) in these two central strips (10), the protective layer (15) and the first (13) and second (14) connecting layers lie transversally beyond the photovoltaic cells in these two central strips. Thus the difference in thickness over all the width of the photovoltaic panel (4) is only the thickness of the photovoltaic cell proper, that is of the order of 50 μm, which is relatively negligible when one compares this difference to the total thickness of the two connecting layers and of the protective layer which can be of the order of 500 to 600 μm. As a result of this particular arrangement, the two central strips (10) are not reduced thickness zones, and the photovoltaic panel (4) has a thickness that is more-or-less constant over all of its width and of course over all of its length along the rear part (9). Naturally whenever possible, the photovoltaic cells can be brought as close as possible to each other in order to limit the width or even to eliminate the said central strips.

In the case of the left lateral strip (11), a first way to reduce the width of this strip is to laterally increase the dimensions of the connecting and protection layers in relation to the photovoltaic cell. In FIG. 2, the first connecting layer (13), the second connecting layer (14) and the protective layer (15) all have the same dimensions, extending over a distance (g) beyond the photovoltaic cell (16). A second way concerns the finishing of the left-hand longitudinal edge of the textile panel. Traditionally, in the area of blinds, the finish consists of forming a rolled hem with a partial fold and stitching. In the area of this rolled hem, the composite (1) has a thickness (E1) which is double that (Eo) of the textile panel (2), corresponding more-or-less to the thickness (E2) of the composite in the zone of the photovoltaic panel (4), including the cell (6). In the case of the right lateral strip (12), this includes the assembly zone (19) between the two textile panels (2, 3). As illustrated in FIG. 2, the assembly is effected by superimposition and gluing of the two superimposed selvedges (2a, 3a) of the two panels (2, 3). In this assembly zone (19), the composite (1) has a thickness (E1) that is more-or-less double the thickness (Eo) of the textile panel, if one includes not only the presence of the glue but also the reduction of thickness of the two textile panel folds due to crushing during the hot lamination process. This assembly zone therefore has more-or-less the same thickness (E2) as the thickness (E2) of the composite at the rear part (9). Thus, in this implementation example, the right lateral strip (12) that forms a zone of reduced thickness extends between the left-hand edge (3b) of the second textile panel (3) and the right-hand edge (4b) of the photovoltaic panel (4) placed on the first textile panel (2).

It is therefore also possible to adjust the width (d) of this zone by adjusting the width of the assembly zone (19).

It can be seen that the simplified diagram of FIG. 2 does not strictly represent the configuration of the composite, in particular when it is rolled onto a reception tube, because of the natural deformation of the textile panel, especially in the reduced thickness zones.

In the embodiment illustrated in FIG. 1, the front part (18) of the composite (1) is free of any photovoltaic panel (4), so that in this front part (18), the thickness of the composite is strictly that of the textile panel (2).

In its implementation as a solar protection blind, the composite (1) has its transverse edge (1a) fixed onto a reception tube (20) in order for it to be rolled, while the opposite transverse edge (1b) of the composite is fixed onto a loading bar (21).

In the example illustrated in FIG. 3, the reception tube (20) is mounted to rotate in a storage body (22) that is cylindrical inside. The loading bar (21) and the storage container (22) are connected by one or more tensioning arms (23). This is an articulated or possibly telescopic arm, suitable for holding apart from each other the loading bar (21) and the container (22) and therefore to put the composite (1) in tension when it is in the deployed position and also when it is rolled around the reception tube (20).

The solar protection device (30) also includes conducting means that are not shown in FIG. 3, for the electrical energy produced by the photovoltaic cells. In fact it is convenient to conduct the electrical power produced by the photovoltaic cells to a storage resource such as a battery, or directly to the power network. Whatever the electrical arrangements adopted, and whether wired in series or parallel, the routing means leave from the electrodes of the cells and pass via the inside of the loading bar (21), via the inside of one or more arms (23) and via the inside of the storage container (22) or of the reception tube (20) to be led finally to the storage resource or the network.

When the composite (1) has been fully rolled around the reception tube (20, the loading bar (21) then closes off the slit (24) of the storage container (15) through which the composite (1) has passed.

In general, one seeks to limit the size of such devices. To this end, one seeks to reduce the outside diameter of the storage container (22), which also leads to a reduction in the said diameter of the reception tube (20). However, a limit to this reduction appears due to the fact that the photovoltaic cells, although they are flexible, cannot be curved around an excessively small radius of curvature or it will break, leading to a fatal malfunction. At present, the acceptable radii of curvature for the photovoltaic cells on the market are of the order of 3 centimeters. The particular arrangement of the composite (1) according to this present invention, illustrated in FIG. 1, according to which the front part (18) is free of any photovoltaic panel, nevertheless allows one to reduce the radius of the rolling tube (20) to a value that is less than the radius of curvature that is allowable for a photovoltaic cell. In fact, during the rolling process, the first turns of the composite (1) are exclusively in the textile panel (2), which itself can be rolled onto a tube of very small diameter. When the rolling of the rear part (9) commences, including the photovoltaic panel (4), the actual diameter of the rolling process is that of the tube (20) with the addition of the turns formed by rolling the front part (18). it is therefore this last diameter that must be considered when deciding the radius of curvature than can be allowed for a photovoltaic cell.

In the example illustrated, the front part (18) represents more-or-less a third of the length of the composite (1). A considerably advantageous reduction in the diameter of the reception tube (20) is nevertheless achieved from a front part having a length (La) that makes it at least a quarter of the total length (Lt) of the composite.

In one precise implementation example of a blind for a dormobile or camper, the total length (Lt) of the composite (1) was 2542 millimeters, and the length (La) of the front part (18) was 1097 millimeters, or 43% of Lt. It should be noted that the front part (18), as well as the extremity of the rear part, both of which are free of any photovoltaic panel, are used for attachment respectively to the reception tube (20) and the loading bar (21). More precisely, in this precise example, the visible part of the front part is of the order of 900 millimeters and the visible part of the rear part (9), corresponding to the photovoltaic panel (4), is of the order of 1400 millimeters. In a first stage, it was possible to implement this composite in the standard equipment employed by the blind manufacturer, with a reception tube (20) having an outside diameter of 63 millimeters and a storage container (22) having an inside diameter of 87 millimeters. As indicated earlier, due to the particular nature of the invention, it will be possible to very substantially reduce the size of the storage container by significantly reducing the diameter of the reception tube to values that are less than or equal to 50 millimeters, or even less than 40 millimeters.

In this same implementation example, the zones (11, 12) said to be of reduced thickness had a thickness (Eo) of the order of 0.6 millimeters corresponding to the thickness of the textile panel only. The rolled hem (17) and the assembly zone (19) had a thickness (E1) of the order of 1.2 millimeters, corresponding to double that of the textile panel. The photovoltaic panel (4) directly facing the photovoltaic cells (6) had a thickness (E2) of the order of 1.3 millimeters.

The invention claimed is:

1. A rollable photovoltaic composite, comprising:
   at least one textile panel;
   at least one flexible photovoltaic panel including a first connecting layer for laminating the at least one flexible photovoltaic panel to the textile panel; and
   the composite, in a transverse direction to a direction in which the composite is rolled, further comprising:
      one or more zones of reduced thickness being about equal to the thickness of the textile panel,
      wherein the width of the one or more zones of reduced thickness being no more than 8 centimeters so as to eliminate the formation of folds during rolling or deployment of the composite.

2. A composite according to claim 1, wherein the photovoltaic panel includes at least one photovoltaic cell, a protective layer covering the at least one photovoltaic cell that allows the passage of light radiation, and a second connecting layer.

3. A composite according to claim 1, wherein the composite having longitudinal edges including a thickness that is substantially double that of the textile panel, the latter having been folded to form a rolled finishing hem.

4. A composite according to claim 1, wherein the composite further includes at least two textile panels assembled in pairs by superimposition and assembly of a portion extending the length of their adjacent longitudinal edges, and wherein onto each textile panel there is laminated at least one photovoltaic cell, and wherein the longitudinal edge of the textile panel lying on top of the other textile panel in the assembly is at a distance (d) from the photovoltaic panel of this other textile panel, with the distance (d) being no greater than 8 centimeters.

5. A composite according to claim 1, wherein the width of the one or more zones of reduced thickness and the distance (d) are no more than 4 centimeters.

6. A composite according to claim 4, wherein the inside faces of the assembled textile panels are covered with an anti-penetration film, except for the portion, known as the reserve portion, of the textile panel lying on top of the other in the assembly.

7. A composite according to claim 1, the composite further comprising a front part, wherein the transverse edge is intended to be fixed to a reception tube in order for it to be rolled, which is free of any photovoltaic panel.

8. A composite according to claim 7, wherein the front part of the composite has a length that is at least a quarter of the total length of the said composite.

9. A solar protection device, comprising:
   a reception tube;
   a loading bar; and
   a composite including at least one textile panel and at least one flexible photovoltaic panel including a first connecting layer for laminating the at least one flexible photovoltaic panel to the textile panel; and
   the composite, in a transverse direction to a direction in which the composite is rolled, further comprising:
      one or more zones of reduced thickness being about equal to the thickness of the textile panel,
      wherein the width of the one or more zones of reduced thickness being no more than 8 centimeters so as to eliminate the formation of folds during rolling or deployment of the composite,
   wherein a front transverse edge of the composite is fixed to the reception tube and a rear transverse edge of the composite is fixed to the loading bar, and at least one arm is connected to the reception tube and to the loading bar in order to provide tensioning of the composite in the deployed position, and the solar protection device further comprises a conducting element for the electrical energy produced by the photovoltaic cell or cells.

10. A device according to claim 9, wherein the composite further comprises a front part, wherein the transverse edge is intended to be fixed to a reception tube in order for it to be rolled, which is free of any photovoltaic panel, and wherein the reception tube has an outside radius that is less than 2.5 centimeters.

11. A device according to claim 10, wherein the front part of the composite has a length that is at least a quarter of the total length of the said composite, and wherein the reception tube has an outside radius that is less than 2 centimeters.

12. A composite according to claim 2, wherein the protective layer is in ETFE.

13. A composite according to claim 5, wherein the width of the one or more zones of reduced thickness and the distance (d) are less than 2 centimeters.

14. A composite according to claim 13, wherein the width and the distance (d) are zero.

15. A composite according to claim 1, wherein the reduced thickness (Eo) of the textile panel covered with a film on its inside face corresponds to the said thickness of the one or more zones of reduced thickness.

16. A rollable photovoltaic composite, comprising:
   at least one textile panel;
   at least one flexible photovoltaic panel including a first connecting layer for laminating the at least one flexible photovoltaic panel to the textile panel; and
   the composite, in a transverse direction to a direction in which the composite is rolled, further comprising:
      one or more zones of reduced thickness being about equal to the thickness of the textile panel,
      wherein the width of the one or more zones of reduced thickness being no more than 8 centimeters so as to eliminate the formation of folds during rolling or deployment of the composite,
   wherein the composite further includes at least two textile panels assembled in pairs by superimposition and assembly of a portion extending the length of their adjacent longitudinal edges, and wherein onto each textile panel there is laminated at least one photovoltaic cell, and wherein a longitudinal edge of the textile panel lying on top of the other textile panel in the assembly is at a distance (d) from the photovoltaic panel of this other textile panel, with the distance being no greater than 8 centimeters, and wherein, in the superimposition and assembly zone, thickness (E1) of the at least two textile panels is substantially double the reduced thickness (E0) of the textile panel.

\* \* \* \* \*